(12) United States Patent
Fukui

(10) Patent No.: US 8,147,596 B2
(45) Date of Patent: Apr. 3, 2012

(54) HYDROGEN PERMEABLE FILM AND METHOD FOR MANUFACTURING THE SAME

(75) Inventor: Katsuhiko Fukui, Iwate (JP)

(73) Assignee: Mikuni Corporation, Tokyo (JP)

(*) Notice: Subject to any disclaimer, the term of this patent is extended or adjusted under 35 U.S.C. 154(b) by 352 days.

(21) Appl. No.: 12/519,024

(22) PCT Filed: Dec. 27, 2007

(86) PCT No.: PCT/JP2007/075082
§ 371 (c)(1),
(2), (4) Date: Jun. 12, 2009

(87) PCT Pub. No.: WO2008/081855
PCT Pub. Date: Jul. 10, 2008

(65) Prior Publication Data
US 2010/0083836 A1    Apr. 8, 2010

(30) Foreign Application Priority Data
Dec. 28, 2006 (JP) ................. 2006-356427

(51) Int. Cl.
*B01D 53/22* (2006.01)
*C23C 14/34* (2006.01)

(52) U.S. Cl. .......... 96/4; 96/7; 96/10; 96/11; 95/45; 95/55; 95/56; 427/115; 427/585

(58) Field of Classification Search ............ 96/4, 7, 96/10, 11; 95/45, 55, 56; 55/523, 524, DIG. 5; 427/115, 585
See application file for complete search history.

(56) References Cited

U.S. PATENT DOCUMENTS

| | | | |
|---|---|---|---|
| 5,518,530 A * | 5/1996 | Sakai et al. | 96/11 |
| 6,899,744 B2 * | 5/2005 | Mundschau | 95/56 |
| 2005/0188845 A1 * | 9/2005 | Yamaguchi et al. | 96/11 |
| 2007/0044662 A1 * | 3/2007 | Song et al. | 96/4 |

FOREIGN PATENT DOCUMENTS

| | | | |
|---|---|---|---|
| JP | 2000-189771 | * | 7/2000 |
| JP | 2000-189771 A | | 7/2000 |
| JP | 2002-071611 A | | 3/2002 |
| JP | 2005-058822 A | | 3/2005 |
| JP | 2005-270966 A | | 10/2005 |
| JP | 2006-204990 A | | 8/2006 |
| JP | 2006-314925 A | | 11/2006 |

OTHER PUBLICATIONS

Periodic Table. National Institute of Standards and Technology. 2003.*

(Continued)

*Primary Examiner* — Jason M Greene
(74) *Attorney, Agent, or Firm* — Norris McLaughlin & Marcus, P.A.

(57) ABSTRACT

A hydrogen-permeable film has a ceramic material of a nitride or oxide of a metal element belonging to group IVB, VB or VIB and hydrogen-permeable metal particles of at least one kind selected from palladium (Pd), niobium (Nb), vanadium (V), tantalum (Ta) and alloys thereof dispersed in the ceramic material. A ratio of the hydrogen-permeable metal particles in the hydrogen-permeable film is 20 to 70 mass %, and a thickness of the hydrogen-permeable film is 5 to 1,000 nm.

7 Claims, 4 Drawing Sheets

OTHER PUBLICATIONS

English Language Abstract for JP2005-270966.
English Language Abstract for JP2006-204990.
English Language Abstract for JP2000-189771.
English Language Abstract for JP2002-071611.
English Language Abstract for JP2005-058822.
English Language Abstract for JP2006-314925.
Masaaki Kitano et al. 'Decomposition of water in the separate evolution of hydrogen and oxygen using visible light-responsive TiO2 thin film photocatalysts: Effect of the work function of the substrates on the yield of the reaction', Applied Catalysis, A: General, 2006, vol. 314, No. 2, pp. 179-183.

* cited by examiner

HYDROGEN PERMEABLE FILM AND METHOD FOR MANUFACTURING THE SAME

TECHNICAL FIELD

The present invention relates to a hydrogen-permeable film, and to a manufacturing method therefor. More specifically, the hydrogen-permeable film of the present invention is suited to applications such as hydrogen gas purification because this film allows selective permeation of only hydrogen gas. Examples of such applications include purification of hydrogen fuel gas which flows for use in automobile fuel cells, household fuel cells, portable fuel cells and the like.

BACKGROUND ART

Demand for hydrogen is expected to increase rapidly in many industrial fields. Under these circumstances, hydrogen-permeable films are being developed that can be used to refine hydrogen gas. Known hydrogen-permeable films include hydrogen-permeable films using palladium (Pd) film. Pd is a rare precious metal and extremely expensive.

Therefore, less expensive materials are being developed as substitutes for Pd. For example, a hydrogen-permeable membrane unit has been proposed which comprises a hydrogen-permeable film consisting of niobium (Nb), vanadium (V), tantalum (Ta) and the like formed on the surface of a porous support that is permeable to gas (Patent Document 1). Patent Document 2 proposes a hydrogen permeating membrane using an alloy of zirconium (Zr) with nickel, chromium, iron, copper, vanadium, titanium or the like.

However, all substitutes for Pd are inferior to Pd in terms of hydrogen permeability. Moreover, as the hydrogen permeates the Pd substitutes they react with the hydrogen, causing hydrogenation and pulverization of the substitutes. Consequently, these substitutes are less durable than Pd.

Hydrogen-permeable films using Pd and Pd substitutes as hydrogen-permeable materials have film thicknesses on the order of a few microns to a few millimeters. In the past, only such extremely thick films have been developed as hydrogen-permeable films. In particularly, hydrogen-permeable films using only Pd as the film material are mechanically weak, and therefore cannot be made thinner than this. Moreover, because hydrogen-permeable materials (particularly Pd) are extremely expensive, manufacturing costs are high if the hydrogen-permeable film has to be thick.

The inventors in this case have done exhaustive research in order to obtain a hydrogen-permeable film that can provide three improved features in terms of functionality, durability and manufacturing costs. As a result, they arrived at a hydrogen-permeable film consisting of Pd or other hydrogen-permeable metal particles dispersed in a ceramic material consisting of a nitride or oxide of aluminum (Al) or silicon (Si), and submitted a previous application (Patent Document 3).

In this hydrogen-permeable film, Pd or other hydrogen-permeable metal particles are roughly uniformly dispersed in a hard ceramic material.

When hydrogen passes through this hydrogen-permeable film, the volume of the hydrogen-permeable metal particles alters as they absorb and then release hydrogen. However, because the hydrogen-permeable metal particles are dispersed in a hard ceramic material, the mechanical stress generated by this change in volume is absorbed and mitigated by the ceramic material. As a result, the hydrogen-permeable film is more durable because it undergoes less deterioration due to changes in the volume of the hydrogen-permeable metal. In addition, the hydrogen-permeable film is cheaper to manufacture because less of the hydrogen-permeable metal is used.

Patent Document 1: Japanese Patent Application Laid-open No. 2002-336664 (Claims)
Patent Document 2: Japanese Patent Application Laid-open No. 1995-000775 (Claims)
Patent Document 3: Japanese Patent Application Laid-open No. 2005-270966 (Claims)

DISCLOSURE OF INVENTION

Technical Problem

One advantage of this hydrogen-permeable film consisting of hydrogen-permeable metal particles dispersed in a ceramic material is that there is less deterioration of the hydrogen-permeable film due to hydrogenation of the hydrogen-permeable metal as discussed above. However, further improvements are needed to resolve problems related to the ceramic material in which the hydrogen-permeable metal particles are dispersed. Problems related to the ceramic material include deterioration of the ceramic material caused by components other than hydrogen gas in the treated gas, and the difficulty of setting the manufacturing conditions for the hydrogen-permeable film.

Specific problems associated with specific ceramic materials are as follows.

When the ceramic material is an Al nitride, the Al nitride has poor steam resistance, and deteriorates due to hydrolysis caused by the steam. Its function as a matrix may be adversely affected if the treated gas contains steam, or if the hydrogen-permeable film is used for a long period of time.

When the ceramic material is a Si nitride, although Si nitrides are resistant to steam, it is difficult to set the conditions for forming a film by vapor phase epitaxy or sputtering. When the stoichiometric ratio of Si to nitrogen in the Si nitride is 1:1, the chemical properties of the ceramic material are stable, and it is resistant to chemical changes caused by components in the treated gas. Therefore, it is desirable to manufacture a ceramic film of Si nitride with a composition of Si:N=1:1 for example. However, ceramic films produced by vapor phase epitaxy or sputtering are likely to have Si-rich compositions. Oxygen and other miscellaneous gases may be adsorbed during use by a hydrogen-permeable film made with a Si-rich Si nitride as the ceramic film material, or reaction products from chemical reactions may adhere to the film. In such cases, a problem arises in which the hydrogen-permeability of the hydrogen-permeable film declines.

When the ceramic material is an Al oxide, the ceramic film is formed using an $Al_2O_3$ target. In this case, because the ceramic film-formation rate is slow, it takes a long time to obtain the desired film thickness. Meanwhile, the production time can be reduced if an Al oxide film is formed by reactive sputtering using an Al target. However, the chamber of the reactive sputtering unit is likely to be contaminated by reactive gas (oxygen in this case). Productivity is thus adversely affected because of the need for frequently cleaning of the chamber.

If the ceramic material is a Si oxide, the ceramic film itself is likely to be porous in a hydrogen-permeable film using a ceramic film of Si oxide. It is difficult to obtain high-purity hydrogen gas if miscellaneous gas also passes through the porous ceramic film. The hydrogen-permeable film therefore needs to be made thicker in order to obtain high-purity hydrogen gas. If the thickness of the hydrogen-permeable film is increased, the permeation rate of the hydrogen gas decreases.

Another drawback is that the film-formation rate of the ceramic film is slow as in the case of Al oxide.

Technical Solution

In light of these circumstances, it is an object of the present invention to provide a hydrogen-permeable film which is easy to form and resists deterioration caused by components other than hydrogen gas (miscellaneous gases) in the treated gas, along with a manufacturing method therefor.

The following is a description of the present invention, which resolves these problems.

[1] A hydrogen-permeable film comprising a ceramic material of a nitride or oxide of a metal element belonging to group IVB, VB or VIB and hydrogen-permeable metal particles of at least one kind selected from palladium (Pd), niobium (Nb), vanadium (V), tantalum (Ta) and alloys thereof dispersed in the ceramic material, wherein the ratio of the hydrogen-permeable metal particles in the hydrogen-permeable film is 20 to 70 mass %, and the thickness of the hydrogen-permeable film is 5 to 1,000 nm.

[2] The hydrogen-permeable film according to [1] above, wherein the hydrogen-permeable metal is Pd or an alloy thereof.

[3] The hydrogen-permeable film according to [1] above, wherein the hydrogen-permeable metal particles are amorphous or rod-shaped with an aspect ratio of 1 to 10.

[4] A hydrogen-permeable film unit comprising the hydrogen-permeable film according to [1] above formed on at least one side of a porous ceramic substrate.

[5] The hydrogen-permeable film unit according to [4] above, wherein the porous ceramic substrate has pores ranging from 1 to 200 nm in diameter.

[6] A hydrogen-permeable film manufacturing method, wherein the hydrogen-permeable film according to [1] above is formed by vapor phase epitaxy or sputtering on at least one side of a porous ceramic substrate.

[7] The hydrogen-permeable film manufacturing method according to [6] above, wherein the porous ceramic substrate has pores ranging from 1 to 200 nm in diameter.

Advantageous Effects

Because the hydrogen-permeable film of the present invention uses a nitride or oxide of a metal element belonging to group IVB, VB or VIB as the ceramic material, the stoichiometric ratios of these metal elements to nitrogen or oxygen are fixed, and a ceramic material with stable chemical properties can be easily obtained. As a result, the film is vulnerable neither to chemical changes caused by components in the treated gas, nor to hydrolysis caused by steam. As a result, the hydrogen-permeable film of the present invention is extremely durable.

The hydrogen-permeable film of the present invention can be manufactured by sputtering or by simultaneous vapor-phase epitaxy of the ceramic material and hydrogen-permeable metal on a porous ceramic substrate. The hydrogen-permeable metal particles obtained by this method are a mixture of amorphous particles and rod-shaped particles with an aspect ratio of 1 to 10. The long axes of the rod-shaped particles contained in the film are arranged uniformly in the direction of thickness of the film. A hydrogen-permeable film containing rod-shaped hydrogen-permeable metal particles has a higher hydrogen gas permeation rate and is more selective for hydrogen gas than a hydrogen-permeable film containing only amorphous particles. It is impermeable to gases other than hydrogen such as nitrogen and oxygen for example. Thus, it has superior separation ability when used for purposes of selectively separating hydrogen gas from mixed gas.

In the hydrogen-permeable film of the present invention, the hydrogen-permeable metal particles are roughly uniformly dispersed in the ceramic material. In a hydrogen-permeable film of the present invention with this structure, the mechanical stress that occurs due to volume changes when the hydrogen-permeable metal particles absorb and release hydrogen is mitigated by the hard ceramic. As a result, deterioration of the hydrogen-permeable film due to hydrogenation of the hydrogen-permeable metal particles is controlled.

The hydrogen-permeable film of the present invention is formed on a rigid porous substrate. Since in this case the hydrogen-permeable film does not need to have great mechanical strength it can be very thin, with a film thickness of 5 to 1000 nm. Even though the hydrogen-permeable film of the present invention is thin, it has hydrogen permeability comparable to that of much thicker conventional permeable films formed from Pd alone. Moreover, since the film is thin, few hydrogen-permeable metal particles are used, and the hydrogen-permeable film of the present invention can be manufactured cheaply.

EXPLANATION OF REFERENCE

Figure 1:
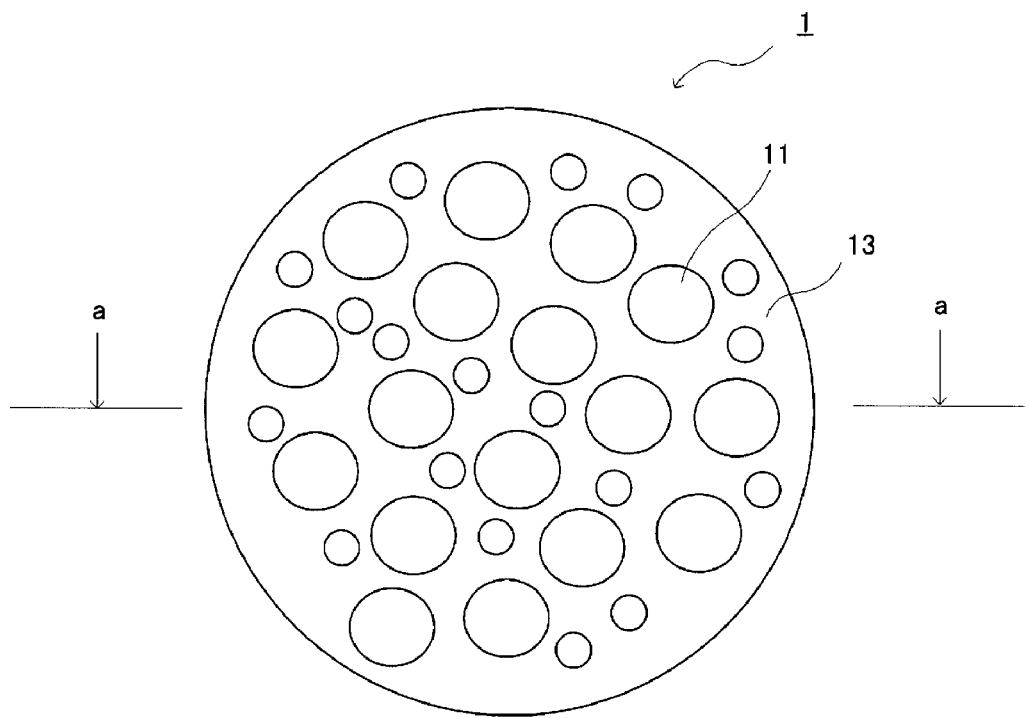
FIG. 1 is a rough plane view showing one example of a hydrogen-permeable film of the present invention.

1 Hydrogen-permeable film
3 Hydrogen-permeable film unit
11 Hydrogen-permeable metal particle
13 Ceramic material
23 Ceramic substrate
25 Seal material
27 Stainless-steel holder
31 Mixed gas cell
33 Mixed gas inlet
35 Mixed gas suction port
37 Mixed gas pressure sensor
41 Permeated gas cell
43 Permeated gas sampling port
45 Permeated gas suction port
47 Permeated gas pressure sensor

BEST MODE FOR CARRYING OUT THE INVENTION

The present invention is explained in detail below with reference to the drawings.

FIG. 1 is a plane view showing one example of the hydrogen-permeable film of the present invention. In the FIG. 1, 1 is a hydrogen-permeable film and 11 is a hydrogen-permeable metal particle, and roughly spherical particles are shown dispersed uniformly in ceramic material 13 (the matrix). The particle diameter of hydrogen-permeable metal particles 11 is 1 to 10 nm or preferably 2 to 8 nm or more preferably 3 to 6 nm, and is smaller than the film thickness of hydrogen-permeable film 1.

Figure 2:
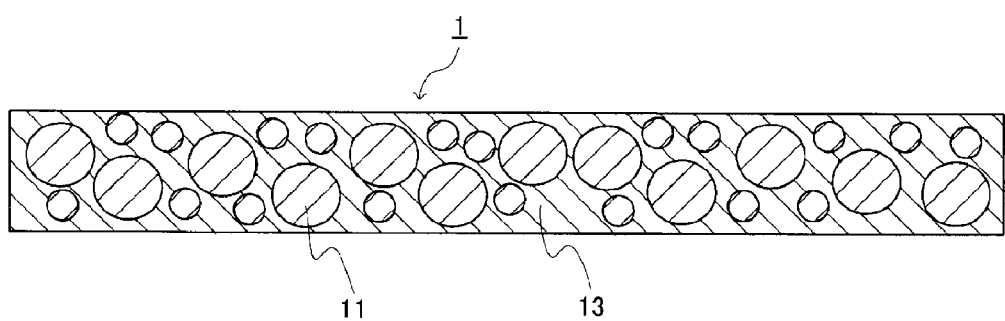
FIG. 2 is a cross-section along the a-a line in FIG. 1.

The cross-section along line a-a in FIG. 1 is shown in FIG. 2. In FIG. 2, the same symbols are used for the same parts shown in FIG. 1. The hydrogen-permeable film is preferably 5 to 1000 nm thick.

Figure 3:
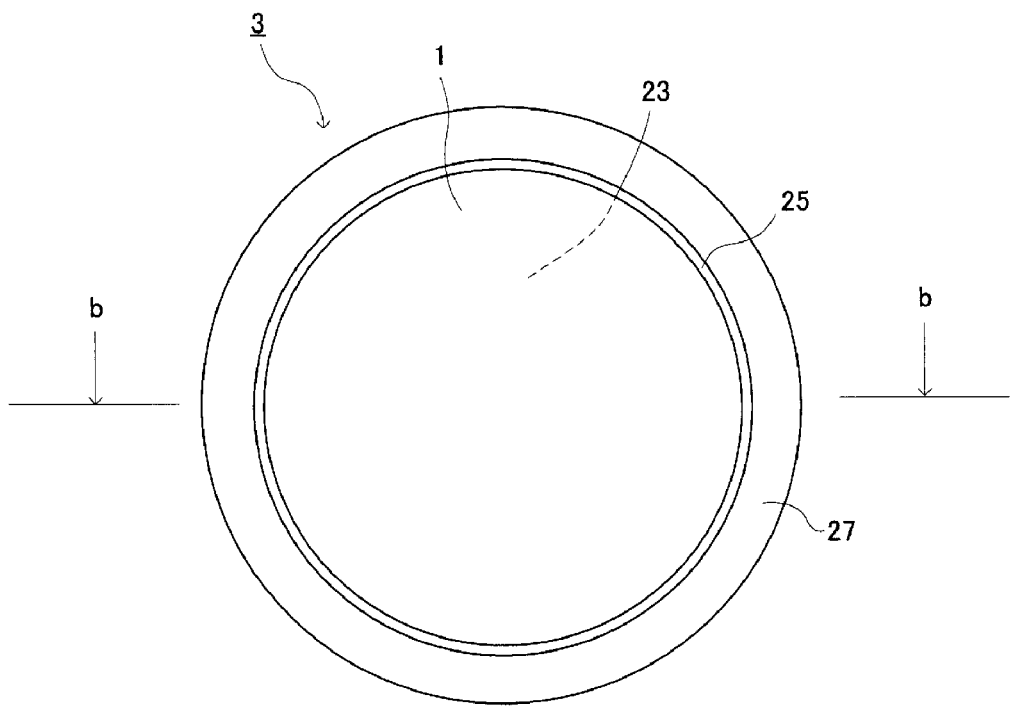
FIG. 3 is a rough plane view showing one example of a hydrogen-permeable film unit of the present invention.

FIG. 3 is a plane view showing one example of a hydrogen-permeable film unit comprising the aforementioned hydrogen-permeable film attached to a holder. In FIG. 3, 3 is the hydrogen-permeable film unit. 27 is a ring-shaped stainless-steel holder, and 23 is a disk-shaped porous ceramic substrate sealed air-tightly inside stainless-steel holder 27. 1 is the hydrogen-permeable film, which is formed on one surface of porous ceramic substrate 23. 25 is a seal material which fills the gap between porous ceramic substrate 23 and stainless steel holder 27, thereby creating an airtight seal between porous ceramic substrate 23 and stainless-steel holder 27.

Examples of sealing methods include brazing sealing methods using brazing materials, such as the refractory metal method and the active metal method. Consequently, the seal material is a material used in these sealing methods. Porous ceramic substrate 23 and stainless-steel holder 27 may also be sealed together using an inorganic adhesive. The seal material 25 fills this gap completely. Porous ceramic substrate 23 may be for example a commercial product with a pore diameter of about 5 nm.

Figure 4:
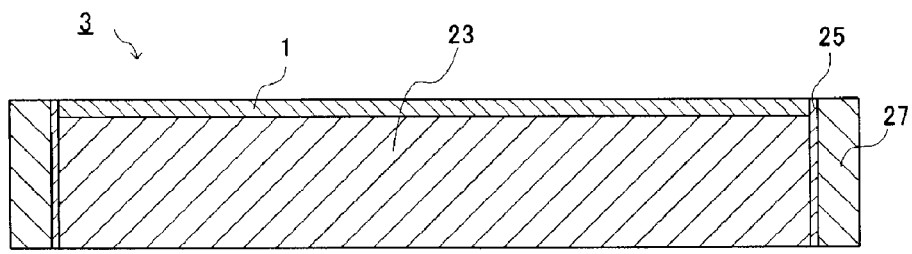
FIG. 4 is a cross-section along with b-b line in FIG. 3.

FIG. 4 shows a cross-section of the hydrogen-permeable unit along the b-b line in FIG. 3. Symbols in FIG. 4 have the same meaning as in FIG. 3.

Figure 5:
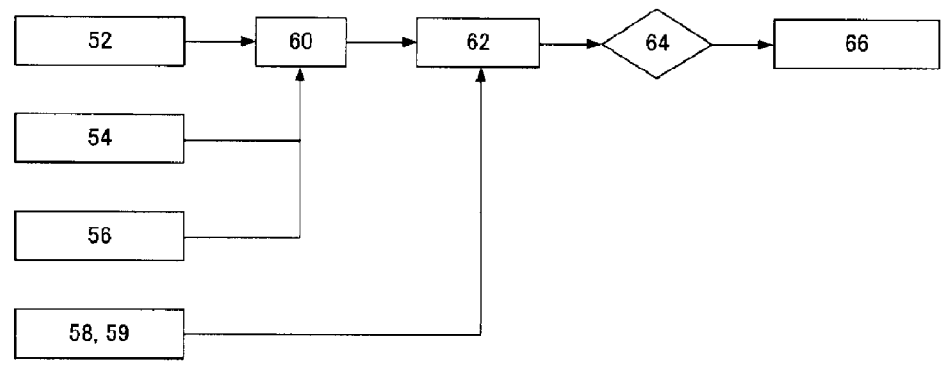
FIG. 5 is a process chart showing one example of a method for manufacturing a hydrogen-permeable film unit of the present invention.

FIG. 5 is a process chart showing one example of a method for manufacturing a hydrogen-permeable film unit of the present invention. Porous ceramic substrate 52 is first mounted on stainless-steel holder 54, the gap between the two is filled with seal material (brazing material) 56, and they are baked 60. In this way, the porous ceramic substrate and stainless-steel holder are made into an airtight unit by means of the sealing agent.

Next, target 58 consisting of a hydrogen-permeable metal or its alloy and target 59 consisting of a ceramic material are attached inside a high-frequency magnetron sputtering unit. Sputtering is then performed in a nitrogen gas and/or oxygen gas atmosphere. In this way, a hydrogen-permeable film is formed 62 on one surface of the porous ceramic substrate. The formed hydrogen-permeable film comprises hydrogen-permeable metal particles or its alloy particles dispersed in a matrix of ceramic material.

The hydrogen-permeable film unit obtained in this way is subjected to quality testing 64 as necessary, and those without quality problems are productized as hydrogen-selective permeable films 66.

Figure 6:
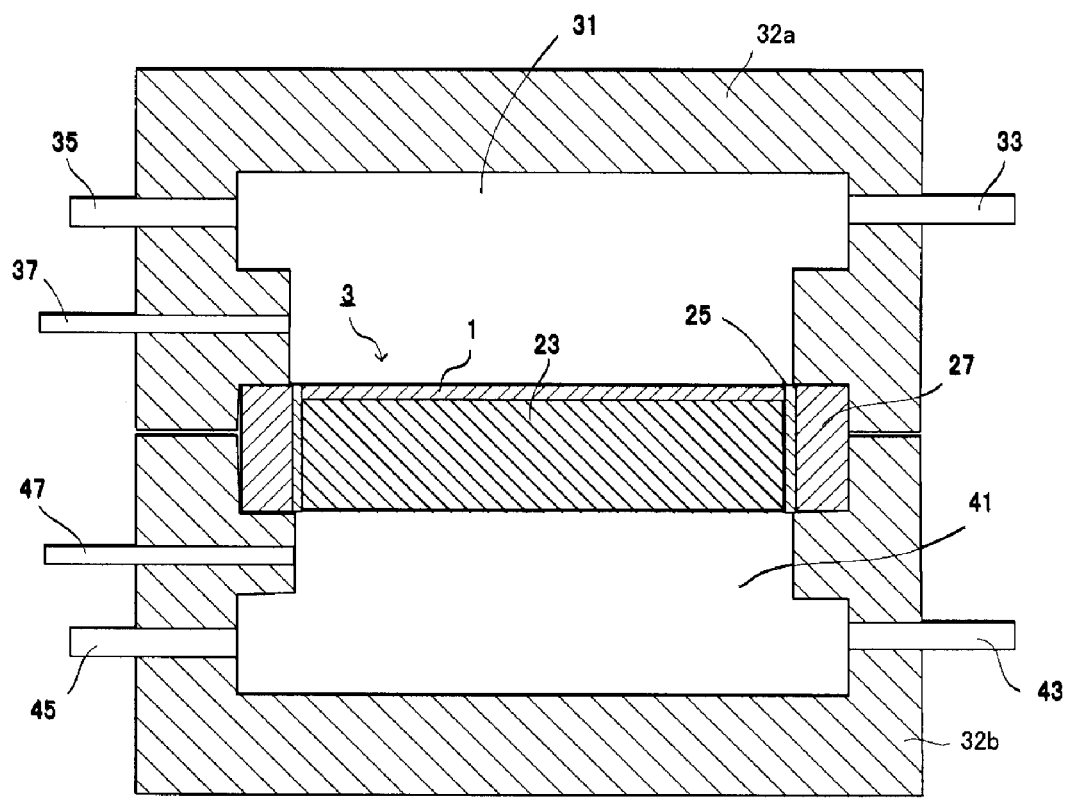
FIG. 6 is a rough cross-section showing one example of a hydrogen permeability tester.

FIG. 6 is a cross-section showing one example of a hydrogen permeability tester used in the examples of the present invention. This hydrogen permeability tester has a hollow center that can be divided into two parts, upper cell 32a and 32b. When hydrogen-permeable film unit 3 is inserted airtightly between upper cell 32a and lower cell 32b, mixed gas cell 31 and permeated gas cell 41 are separated by the hydrogen-permeable film unit between them.

31 is a mixed gas cell, 33 is a mixed gas inlet for supplying test gas to the mixed gas cell, 35 is a suction port for mixed gas in the mixed gas cell, 37 is a pressure sensor, 41 is a permeated gas cell, 43 is a permeated gas sampling port, 45 is a suction port for permeated gas in the permeated gas cell, and 47 is a pressure sensor for the permeated gas cell. Other symbols shown in FIG. 6 have the same meaning as in FIG. 3.

(Hydrogen-Permeable Metal Particles)

In the present invention, hydrogen-permeable metal particles 11 are particles consisting of at least one kind selected from palladium (Pd), niobium (Nb), vanadium (V), tantalum (Ta) or alloys of these. These hydrogen-permeable metal particles may be dispersed in the ceramic material as metal element particles, or may be dispersed as alloy particles. Alloys of hydrogen-permeable metal are alloys conventionally used in manufacturing materials for hydrogen-permeable films. Examples of alloys of hydrogen-permeable metals include alloys of the aforementioned hydrogen-permeable metals with calcium, iron, copper, vanadium, nickel, titanium, chromium, zirconium, silver and other metals.

Of these hydrogen-permeable metal particles, Pd particles and Pd alloy particles are particularly desirable because of their excellent hydrogen permeability.

The form of hydrogen-permeable metal particles 11 is not particularly limited, and may be any form include spherical, ovoid, rectangular, cylindrical, amorphous and the like. Of these, a hydrogen-permeable film having dispersed hydrogen-permeable metal particles 11 in a cylindrical, columnar, ovoid or other rod shape with a high aspect ratio is preferable because it is more hydrogen permeable than a hydrogen-permeable film having dispersed hydrogen-permeable metal particles of another particle shape.

In the case of a hydrogen-permeable film comprising hydrogen-permeable metal particles having a rod shape with a high aspect ratio dispersed in ceramic material 13, the hydrogen permeability of the hydrogen-permeable film is especially great if the long axes of hydrogen-permeable metal particles 11 are aligned in the direction of thickness of hydrogen-permeable film 1. The aspect ratio of the rod-shaped particles is preferably 1 to 10 or more preferably 2 to 7 or still more preferably 3 to 5.

In the hydrogen-permeable film of the present invention, these hydrogen-permeable metal particles are preferably dispersed uniformly in the ceramic material.

The content ratio of the hydrogen-permeable metal particles in the hydrogen-permeable film is 20 to 70 mass % or preferably 35 to 60 mass % or more preferably 38 to 50 mass %. If this content ratio is less than 20 mass %, hydrogen permeability will be insufficient. If this content ratio exceeds 70 mass %, on the other hand, conspicuous hydrogen-permeable film deterioration, which derives from the hydrogenation of the hydrogen-permeable film in hydrogen permutation, will be exhibited. If the content ratio exceeds 70 mass %, the mechanical strength of the hydrogen-permeable film will be insufficient, making it difficult to obtain a thin hydrogen-permeable film with a thickness of 5 to 1000 nm.

When the hydrogen-permeable film is obtained by sputtering as described below, the desired content ratio of hydrogen-permeable metal particles in the hydrogen-permeable film can be obtained by means of method (a), (b) or (c) for example:

(a) By using a composite target comprising a plate of hydrogen-permeable metal material fixed on a ceramic material target, and adjusting the plate area of the hydrogen-permeable metal material;

(b) By adjusting the (sputtering?) output of the ceramic material target or hydrogen-permeable metal material target in the case of simultaneous sputtering using a ceramic material target and a hydrogen-permeable metal material target;

(c) By using a mixed ceramic material/hydrogen-permeable metal target comprising a hydrogen-permeable metal dispersed at a specific content ratio in a ceramic target (or a metal target as the raw material for the ceramic in the case of reactive sputtering); in this case, the content ratio of the hydrogen-permeable metal contained in the ceramic material target is adjusted.

(Ceramic Material)

Ceramic material 3, which makes up the matrix of hydrogen-permeable film 1, is preferably a nitride or oxide of a metal element from group IVB, VB or VIB. Specific examples of ceramic material 3 include $TiN_{0.3-2.5}$, $ZrN_{0.3-2.5}$, $HfN_{0.3-2.5}$, $VN_{0.3-2.5}$, $NbN_{0.3-2.5}$, $TaN_{0.8-2}$, $CrN_{0.5-3}$, $MoN_{0.5-3}$, $WN_{0.5-3}$ and other nitrides and $TiO_{0.5-3}$, $ZrO_{1-3}$, $HfO_{1-3}$, $VO_{0.5-3}$, $NbO_{0.5-3}$, $TaO_{1-3}$, $CrO_{0.5-5}$, $MoO_{1-4}$, $WO_{1-4}$ and other oxides.

Of the nitrides, $TaN_{0.8-2}$, $WN_{0.5-3}$, $HfN_{0.3-2.5}$, $TiN_{0.3-2.5}$, $ZrN_{0.3-2.5}$ and the like are preferred. Of the oxides, $HfO_{1-3}$, $TaO_{1-3}$, $WO_{1-4}$, $TiO_{0.5-3}$, $VO_{0.5-3}$ and the like are preferred.

(Hydrogen-Permeable Film Thickness)

Hydrogen-permeable film 1 of the present invention is 5 to 1000 nm or preferably 10 to 500 nm thick. If the thickness is less than 5 nm the hydrogen-permeable film will be insufficiently strong. If the thickness exceeds 1000 nm, on the other hand, hydrogen permeability will be poor, and the cost savings obtained by using less of the hydrogen-permeable metal will be less. When Pd is used as the hydrogen-permeable metal, moreover, the permeable film can be especially thin because Pd has excellent ability to separate hydrogen gas from other gases.

(Porous Ceramic Substrate)

Gas can permeate between the front and back of porous ceramic substrate 23 through pores inside the substrate. A common commercial porous ceramic can be used for the porous ceramic substrate in the present invention. The pores in the porous ceramic substrate have a diameter of preferably 1 to 200 nm or more preferably 5 to 100 nm. If the pore diameter is less than 1 nm, hydrogen permeability will be insufficient. If it exceeds 200 nm, the ability to separate hydrogen gas from other gases (such as nitrogen gas) will be insufficient. It is desirable that continuous pores be formed between the front and back of the porous ceramic substrate.

(Hydrogen-Permeable Film Manufacturing Method)

The hydrogen-permeable film of the present invention is obtained by forming, on at least one side of porous ceramic substrate 23, a thin film consisting of a ceramic material wherein are dispersed particles of a hydrogen-permeable metal or alloy thereof. The film is preferably formed either by sputtering or by simultaneous vapor phase epitaxy of the ceramic material and hydrogen-permeable metal.

Vapor phase epitaxy of the hydrogen-permeable film is a film-forming method in which for example Pd metal and tantalum (Ta) are heated in a nitrogen gas atmosphere, and precipitated as a thin film on a porous ceramic or other substrate as a mixture of Pd (hydrogen-permeable metal) and $TaN_{0.8-2}$. When the ceramic material is $TaO_{1-3}$, vapor phase epitaxy of the hydrogen-permeable metal and Ta for example can be performed in an oxygen gas atmosphere.

Film-formation can also be performed as with Ta using another metal from the group IVB, VB or VIB metal elements.

The hydrogen-permeable metal particles contained in a hydrogen-permeable film obtained by the aforementioned method are normally a mixture of roughly spherical amorphous particles and rod-shaped particles with an aspect ratio of 1 to 10. The following methods (a) and (b) for example can be combined to form a film with a higher content ratio of rod-shaped particles:

(a) Heating the substrate so that the film-forming temperature is 150° C. or more when forming the film on the porous ceramic substrate;

(b) Selecting the ceramic material so that the combination of hydrogen-permeable metal and ceramic material so that it is difficult for the hydrogen-permeable metal to be in solid solution in the crystal lattice of the ceramic material.

EXAMPLES

Example 1

A hydrogen-permeable film was formed on a porous ceramic substrate using a ternary high-frequency magnetron sputtering unit. The resulting hydrogen-permeable film was a TaN—Pd film.

A porous ceramic substrate was first arranged inside a ternary high-frequency magnetron sputtering unit in which a Ta target and Pd target had been previously attached, with the atmospheric pressure maintained at about $4 \times 10^{-5}$ Pa. Next, argon gas and nitrogen gas (volume ratio 40:60) were supplied to the unit to obtain an atmospheric pressure of $9.31 \times 10^{-1}$ Pa. The substrate temperature was set to 200° C., and sputtering was performed. The outputs of the Ta target and Pd target were set to 200 W and 70 W, respectively.

As a result, a hydrogen-permeable film comprising Pd particles finely dispersed in a $TaN_{0.8-2}$ matrix was formed on the porous ceramic substrate. The thickness of the hydrogen-permeable film was 20 nm as measured with a stylus profile measuring system.

Figure 7:
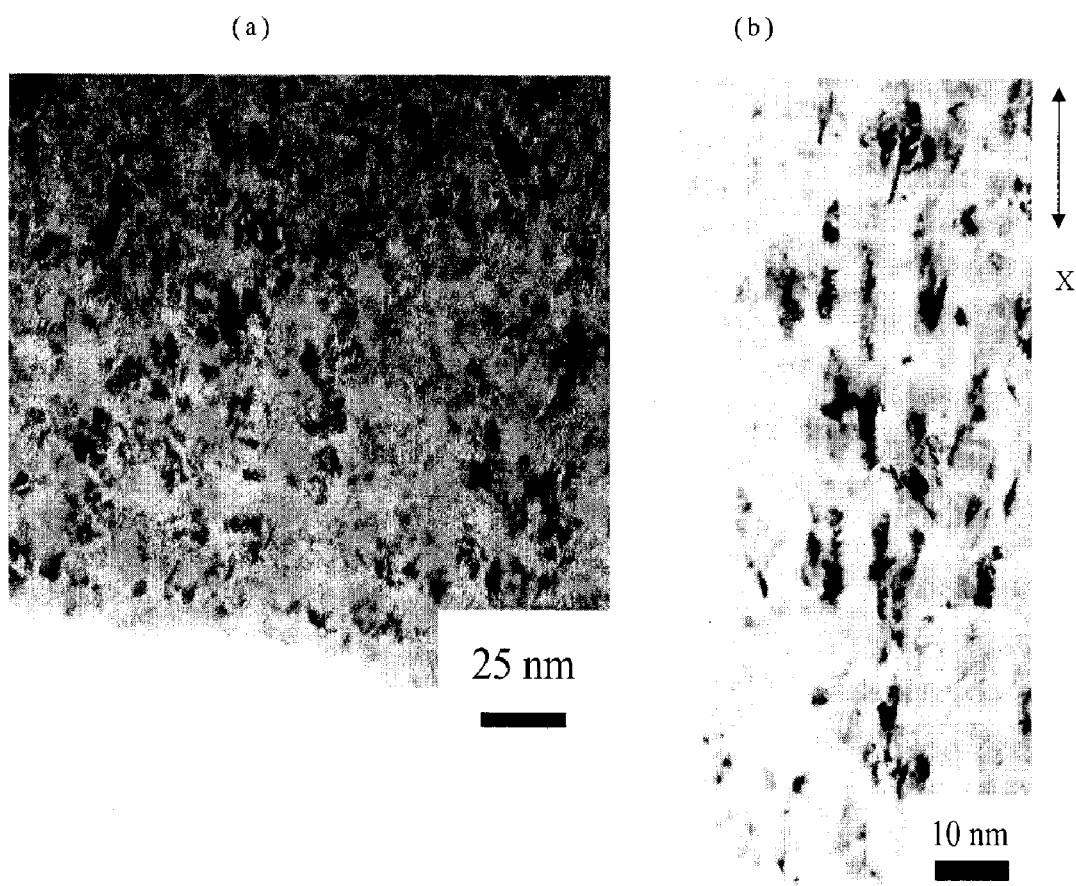
FIG. 7($a$) is a scanning electron microscope image of a cross-section parallel to the surface of the hydrogen-permeable film obtained in Example 1, while FIG. 7($b$) is a scanning electron microscope image of a cross-section along the direction of thickness.

In order to observe the distribution of the Pd particles, a film was formed under the same conditions except with a film thickness of 1000 nm to prepare a sample for observation. This sample was etched by ion milling to a depth suitable for observation, and was observed with a TEM (transmission electron microscope). Photographs of this are shown in FIGS. 7(a) and (b). As shown in FIG. 7(a), Pd particles with a diameter of 25 nm or less and a roughly circular cross-section were observed in a cross-section parallel to the surface of the film. Meanwhile, as shown in FIG. 7(b), rod-shaped Pd particles with a short-axial length of 3 to 5 nm, a long axial length of 10 to 20 nm and an aspect ratio of 2 to 7 were observed in a cross-section made in the direction of thickness of the film. The long axes of the rod-shaped particles were generally aligned in the direction of thickness of the film. In FIG. 7(b), the X arrow indicates the direction of thickness of the film.

The Pd content of the resulting hydrogen-permeable film was 53 mass % as analyzed with an energy dispersive x-ray analyzer (EDX). The proportion of rod-shaped Pd particles as a percentage of the total Pd content of the hydrogen-permeable film was 60 mass %.

The manufactured hydrogen-permeable film was mounted on the hydrogen permeability tester shown in FIG. 6, and the hydrogen permeability of the film was evaluated.

The rate of hydrogen permeation was about $1.8 \times 10^{-6}$ mol/$m^2$/s/Pa.

Example 2

A hydrogen-permeable film 100 nm thick comprising Pd particles dispersed in a matrix of $TaN_{0.8-2}$ was formed on a glass substrate by reactive sputtering in which Ta and Pd targets were sputtered simultaneously. The pressure was set at $9.31 \times 10^{-1}$ Pa, and the substrate temperature at 200° C. The volume ratio of argon gas to nitrogen gas supplied to the sputtering unit was 40:60, and the target outputs were Ta 160 W, Pd 35 W. The content of Pd particles in the resulting hydrogen-permeable film was 45 mass %.

The manufactured hydrogen-permeable film was mounted on the hydrogen permeability tester shown in FIG. 6, and the hydrogen permeability of the film was evaluated.

The rate of hydrogen permeation was about $1.8 \times 10^{-6}$ mol/$m^2$/s/Pa.

Example 3

A hydrogen-permeable film 100 nm thick comprising Pd particles dispersed in a matrix of $HfO_{1-3}$ was formed on a glass substrate by reactive sputtering in which $HfO_2$ and Pd targets were sputtered simultaneously. The sputtering unit contained vacuum (1 Pa or less), and the target outputs were $HfO_2$ 220 W, Pd 40 W. The content of Pd particles in the resulting hydrogen-permeable film was 35 mass %.

The manufactured hydrogen-permeable film was mounted on the hydrogen permeability tester shown in FIG. 6, and the hydrogen permeability of the film was evaluated.

The rate of hydrogen permeation was about $1.0 \times 10^{-6}$ mol/$m^2$/s/Pa.

Comparative Example 4

A hydrogen-permeable film comprising Pd particles dispersed in a matrix of $AlN_{0.5-1.5}$ was formed on a glass substrate by reactive sputtering in which Al and Pd targets were sputtered simultaneously. The atmospheric pressure inside the sputtering unit was $9.31 \times 10^{-1}$ Pa, and the substrate temperature was set to 200° C. The volume ratio of argon gas to nitrogen gas introduced into the sputtering unit was 70:30, and the target outputs were Al 150 W, Pd 30 W. The content of Pd particles in the resulting hydrogen-permeable film was 30 mass %.

The manufactured hydrogen-permeable film was mounted on the hydrogen permeability tester shown in FIG. 6, and the hydrogen permeability of the film was evaluated.

The rate of hydrogen permeation was about $7.0 \times 10^{-7}$ mol/$m^2$/s/Pa.

Test Example

The following boiling water immersion test was performed using the hydrogen-permeable film samples produced in Examples 2 and 3 and Comparative Example 1 in order to investigate the water-resistance of the hydrogen-permeable films.

A 500 ml beaker filled with 500 ml of ion-exchange water was placed on a hot plate and heated. Once the water had begun to boil, a glass substrate with the hydrogen-permeable film formed thereon was dipped in the boiling water with tweezers. The glass plate was removed after 30 minutes, 5 hours and 24 hours, and the surface of the hydrogen-permeable film was observed under an optical microscope (450× magnification).

As a result, corrosion of the $AlN_{0.5-1.5}$ film was observed after 30 minutes, and continued to progress as time passed. No corrosion of the $TaN_{0.8-2}$ or $HfO_{1-3}$ films was observed even after 24 hours.

The invention claimed is:

1. A hydrogen-permeable film comprising a ceramic material of a nitride or oxide of a metal element belonging to group IVB, VB or VIB and hydrogen-permeable metal particles of at least one kind selected from the group consisting of palladium (Pd), niobium (Nb), vanadium (V), tantalum (Ta) and alloys thereof dispersed in the ceramic material, wherein a ratio of the hydrogen-permeable metal particles in the hydrogen-permeable film is 20 to 70 mass %, and a thickness of the hydrogen-permeable film is 5 to 1,000 nm.

2. The hydrogen-permeable film according to claim 1, wherein the hydrogen-permeable metal is Pd or an alloy thereof.

3. The hydrogen-permeable film according to claim 1, wherein the hydrogen-permeable metal particles are amorphous or rod-shaped with an aspect ratio of 1 to 10.

4. A hydrogen-permeable film unit comprising the hydrogen-permeable film according to claim 1 formed on at least one side of a porous ceramic substrate.

5. The hydrogen-permeable film unit according to claim 4, wherein the porous ceramic substrate has pores ranging from 1 to 200 nm in diameter.

6. A hydrogen-permeable film manufacturing method, wherein the hydrogen-permeable film according to claim 1 is formed by vapor phase epitaxy or sputtering on at least one side of a porous ceramic substrate.

7. The hydrogen-permeable film manufacturing method according to claim 6, wherein the porous ceramic substrate has pores ranging from 1 to 200 nm in diameter.

* * * * *